United States Patent
Liu et al.

(10) Patent No.: US 8,609,184 B2
(45) Date of Patent: Dec. 17, 2013

(54) SYSTEM AND METHOD FOR DEPOSITING A LUBRICANT MATERIAL ON A HYDROPHOBIC SURFACE

(75) Inventors: Jianwei Liu, Fremont, CA (US); Michael J. Stirniman, Fremont, CA (US); Li-Peng Wang, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 855 days.

(21) Appl. No.: 11/761,909

(22) Filed: Jun. 12, 2007

(65) Prior Publication Data

US 2007/0231472 A1    Oct. 4, 2007

Related U.S. Application Data

(62) Division of application No. 10/740,706, filed on Dec. 19, 2003, now Pat. No. 7,244,521.

(51) Int. Cl.
*C23C 14/28*    (2006.01)
(52) U.S. Cl.
USPC .......................................................... 427/128
(58) Field of Classification Search
USPC ............... 427/558, 57, 99.4, 97.5; 420/427.4; 29/898.1; 428/835.6, 835.4, 835.3, 428/835.7, 835.8, 840.4, 843.4, 843.5
See application file for complete search history.

(56) References Cited

U.S. PATENT DOCUMENTS

| | | | |
|---|---|---|---|
| 4,995,028 A * | 2/1991 | Boling et al. | 369/275.5 |
| 5,030,478 A * | 7/1991 | Lin et al. | 427/558 |
| 5,409,738 A | 4/1995 | Matsunuma et al. | |
| 5,489,480 A * | 2/1996 | Usuki et al. | 428/421 |
| 5,981,018 A * | 11/1999 | Lai et al. | 428/832.2 |
| 6,099,762 A * | 8/2000 | Lewis | 264/1.33 |
| 6,511,716 B1 | 1/2003 | Itai et al. | |
| 6,589,641 B1 | 7/2003 | Stirniman et al. | |
| 6,627,302 B1 * | 9/2003 | Tang et al. | 428/212 |
| 6,638,622 B2 * | 10/2003 | Dai et al. | 428/408 |
| 6,673,429 B1 * | 1/2004 | Ma et al. | 428/833.6 |
| 6,940,692 B2 * | 9/2005 | Dai et al. | 360/126 |
| 7,361,380 B1 * | 4/2008 | Liu et al. | 427/131 |
| 2004/0023033 A1 * | 2/2004 | Dai et al. | 428/408 |
| 2004/0200981 A1 * | 10/2004 | Liu et al. | 250/492.1 |

OTHER PUBLICATIONS

H. J. Lee et al, Journal of vacuum science and technology. A, 11(3)1993, 711-714.*
Lee et al, Journal of Vac. Sc. Tech A. 11(3), 1993711-714.*

* cited by examiner

*Primary Examiner* — Micheal Cleveland
*Assistant Examiner* — Tabassom Tadayyon Eslami
(74) *Attorney, Agent, or Firm* — Foley & Lardner LLP

(57) ABSTRACT

A system and method for corrosion problems in magnetic media resulting from moisture penetrating through the carbon layer into the magnetic layer by diffusion or other methods are overcome by processing the carbon overcoat to stop and/or inhibit the moisture penetration. The process involves removing moisture channels from protective overcoats of thin film magnetic media by irradiating the protective overcoat with ultraviolet (UV) radiation in an inert hydrophobic chemical environment. Afterwards, the thin film magnetic media can be removed into ambient atmosphere where it is coated with a lubricant.

16 Claims, 8 Drawing Sheets

SYSTEM AND METHOD FOR DEPOSITING A LUBRICANT MATERIAL ON A HYDROPHOBIC SURFACE

This application is a division of U.S. application Ser. No. 10/740,706, filed Dec. 19, 2003, now allowed.

BACKGROUND OF THE INVENTION

1. Field of the Invention

The present invention relates generally to the field of disc drive storage, and more particularly to improved corrosion resistant magnetic media used in disc drives.

2. Description of the Related Art

Computer disc drives commonly use components made out of thin films to store information. Both the read-write element and the magnetic storage media of disc drives are typically made from thin films.

FIG. 1A is an illustration showing the layers of a conventional magnetic media structure including a substrate 105, a seed layer 109, a magnetic layer 113, a diamond like carbon (DLC) protective layer 117, and a lube layer 121. The initial layer of the media structure is the substrate 105, which is typically made of nickel-phosphorous plated aluminum or glass that has been textured. The seed layer 109, typically made of chromium, is a thin film that is deposited onto the substrate 105 creating an interface of intermixed substrate 105 layer molecules and seed layer 109 molecules between the two. The magnetic layer 113, typically made of a magnetic alloy containing cobalt (Co), platinum (Pt) and chromium (Cr), is a thin film deposited on top of the seed layer 109 creating a second interface of intermixed seed layer 109 molecules and magnetic layer 113 molecules between the two. The DLC protective layer 117, typically made of carbon and hydrogen, is a thin film that is deposited on top of the magnetic layer 113 creating a third interface of intermixed magnetic layer 113 molecules and DLC protective layer 117 molecules between the two. Finally the lube layer 121, which is a lubricant typically made of a polymer containing carbon (C) and fluorine (F) and oxygen (O), is deposited on top of the DLC protective layer 117 creating a fourth interface of intermixed DLC protective layer 117 molecules and lube layer 121 molecules.

The durability and reliability of recording media is achieved primarily by the application of the DLC protective layer 117 and the lube layer 121. The DLC protective layer 117 is typically an amorphous film called diamond like carbon (DLC), which contains carbon and hydrogen and exhibits properties between those of graphite and diamond. Thin layers of DLC are deposited on disks using conventional thin film deposition techniques such as ion beam deposition (IBD), plasma enhanced chemical vapor deposition (PECVD), magnetron sputtering, radio frequency sputtering or chemical vapor deposition (CVD). During the deposition process, adjusting sputtering gas mixtures of argon and hydrogen varies the concentrations of hydrogen found in the DLC. Since typical thicknesses of DLC protective layer 117, are less than 100 Angstroms, lube layer 121 is deposited on top of the DLC protective layer 117, for added protection, lubrication and enhanced disk drive reliability. Lube layer 121 further reduces wear of the disc due to contact with the magnetic head assembly.

FIG. 1B is an illustration showing an enlarged view of the DLC protective layer 117 with pinholes that allow moisture to penetrate through the DLC protective layer 117 and cause corrosion. DLC protective layer 117 includes first pinhole 130, second pinhole 132, third pinhole 134, fourth pinhole 136, and fifth pinhole 138. Water molecules 140 condense on the surface of DLC protective layer 117 and migrate down into the pinholes. Some of the pinholes are deeper than others. Water molecules can migrate down the deeper holes and corrode the magnetic layer 115. Although, the deeper pinholes have a higher chance of causing corrosion in the magnetic layer, corrosion can still occur when water molecules are trapped in the more shallow pinholes.

One way water molecules 140 condense on the surface of the DLC protective layer and migrate down the pinholes is when the magnetic media structure is taken out of the vacuum chamber and transported to the lubrication station where the lube layer 121 is deposited over the DLC protective layer 117. This transfer process usually involves moving the magnetic media structure without the lube layer 121 in an ambient atmosphere that contains moisture. Once the water molecules 140 have condensed on the surface of the DLC protective layer 117 they will be trapped there by the subsequently lube layer 121 if they are not removed before applying the lube layer 121. It is important to note that even if the water molecules 140 are removed, the lube layer 121 must be applied before the water molecules re-condense on the surface DLC protective layer 117. This can be a difficult task considering that the lubrication process is usually done by dipping the media in a tank of lubricant material, as is further discussed with reference to FIG. 1C below.

FIG. 1C is a flow chart showing the typical steps used to deposit a carbon overcoat and lubrication layer of the magnetic media structure shown in FIG. 1A. The process begins with step 150 by transferring a partially complete media with substrate 105 and seed layer 109, into a vacuum chamber. The transferring process typically involves moving a disk, after depositing the seed layer 109 on it, into a deposition chamber used to deposit metals that make up the magnetic layer 113 without taking it out of vacuum. Next in step 155, the magnetic layer 113 is deposited onto the seed layer 109 using conventional thin film deposition techniques such as sputtering, CVD, PVD etc. The magnetic layer 113 can be a single layer or can comprise multiple layers of both magnetic and non-magnetic materials. For example a typical magnetic layer can consist of 20 bi-layers consecutively stacked on top of each other with each bi-layer consisting of a magnetic layer and a non-magnetic layer. These materials are all deposited in step 155 to make up the magnetic layer.

Next in step 160, the substrate with the magnetic layer 113 is moved to the protective layer deposition chamber where a protective overcoat layer 117 is deposited on the magnetic layer 113. In step 160, the protective layer 117 consisting of an amorphous carbon is deposited over the partially complete media. Typically the amorphous carbon layer is diamond like carbon (DLC) that has been deposited by conventional sputter deposition techniques. Next in step 165, the amorphous carbon is removed from the deposition chamber and moved into a lubrication station. Typically, this involves removing the magnetic media with a carbon containing overcoat from the vacuum chamber and moving it in atmosphere to the lubrication station. Next in step 170 the protective overcoat 117 is coated with a lube layer 121 using a dipping process wherein the magnetic media having a protective overcoat is dipped into a bath of lubricant and the lubricant is consequently drained from the bath leaving a layer of lubricant on the protective overcoat 117. The lubricant can contain Moresco lubricant or PFPE. Finally, in step 175 the lubed magnetic media is transferred to the next manufacturing operation.

In step 160, the lube layer 121 can be applied using several processes including dipping the magnetic media, which has a protective layer 117, into a tank of lubricant fluid or vapor lubing the disk. If the lube layer 121 is applied with a dipping process, the magnetic media with protective layer 117 is first taken out of vacuum and dipped into a tank of lubricant fluid.

In the dipping process, lube layer 121 is typically applied evenly over the disc, as a thin film, by dipping the discs in a bath containing a mixture of a few percent of the lubricant in a solvent and gradually draining the mixture from the bath at a controlled rate. The solvent remaining on the disc evaporates and leaves behind a layer of lubricant less than 100 Angstroms.

When the magnetic media containing amorphous carbon is removed from the deposition chamber and moved into a lubrication station, in step 165, the exposed carbon layer is subjected to moisture, which causes corrosion. Moisture is one of the indispensable ingredients for media corrosion at typical drive operation environments. Moreover, moisture that penetrates the carbon layer and reaches the magnetic layer is one of the most likely causes of corrosion in hard disk drives. As carbon layer become thinner this problem becomes more serious because it is easier for moisture to penetrate through the thinner carbon layer and corrode the magnetic layer. Performance of hard disk drives is heavily dependent on the corrosion resistance of the media.

Therefore what is needed is a system and method that overcomes corrosion problems by stopping and/or inhibiting moisture from penetrating through the carbon layer into the magnetic layer by diffusion or other methods. Additionally, a system and method that reduces corrosion problems of a magnetic disk is needed that prevents moisture from diffusing through both the carbon protective layer and the lubricant overcoat.

SUMMARY OF THE INVENTION

Corrosion problems in magnetic media resulting from moisture penetrating through the carbon layer into the magnetic layer by diffusion or other methods are overcome by processing the carbon overcoat to stop and/or inhibit the moisture penetration. The process involves removing moisture channels from protective overcoats of thin film magnetic media by irradiating the protective overcoat with ultraviolet (UV) radiation in an inert hydrophobic chemical environment. Afterwards, the thin film magnetic media can be removed into ambient atmosphere where it is coated with a lubricant.

UV irradiation of the surface of the protective overcoat removes absorbed moisture from that surface. The inert hydrophobic chemical in the processing environment replace the moisture that is removed from the surface of the magnetic media and rejuvenates the surface. The UV irradiation is done in an inert hydrophobic chemical environment so that moisture is prevented from reabsorbing back on the protective overcoat surface. The hydrophobic chemicals occupy the pinhole surfaces before the media is exposed to moisture in ambient atmosphere. Since the hydrophobic chemicals occupy the pinholes, moisture is prevented from penetrating through the pinholes and corroding the layers beneath the protective overcoat surface. Therefore, media should be kept in either an atmosphere saturated with hydrophobic chemical vapor or even in a hydrophobic chemical solution during the UV exposure.

Hydrophobic chemicals that can be applied to this application include low molecular weight perfluoropol yether, fluoroalkane, fluoroether, chlorofluoroalkane, chlorofluoroether, etc.

These and various other features as well as advantages which characterize the present invention will be apparent upon reading of the following detailed description and review of the associated drawings.

BRIEF DESCRIPTION OF THE INVENTION

Figure 4:
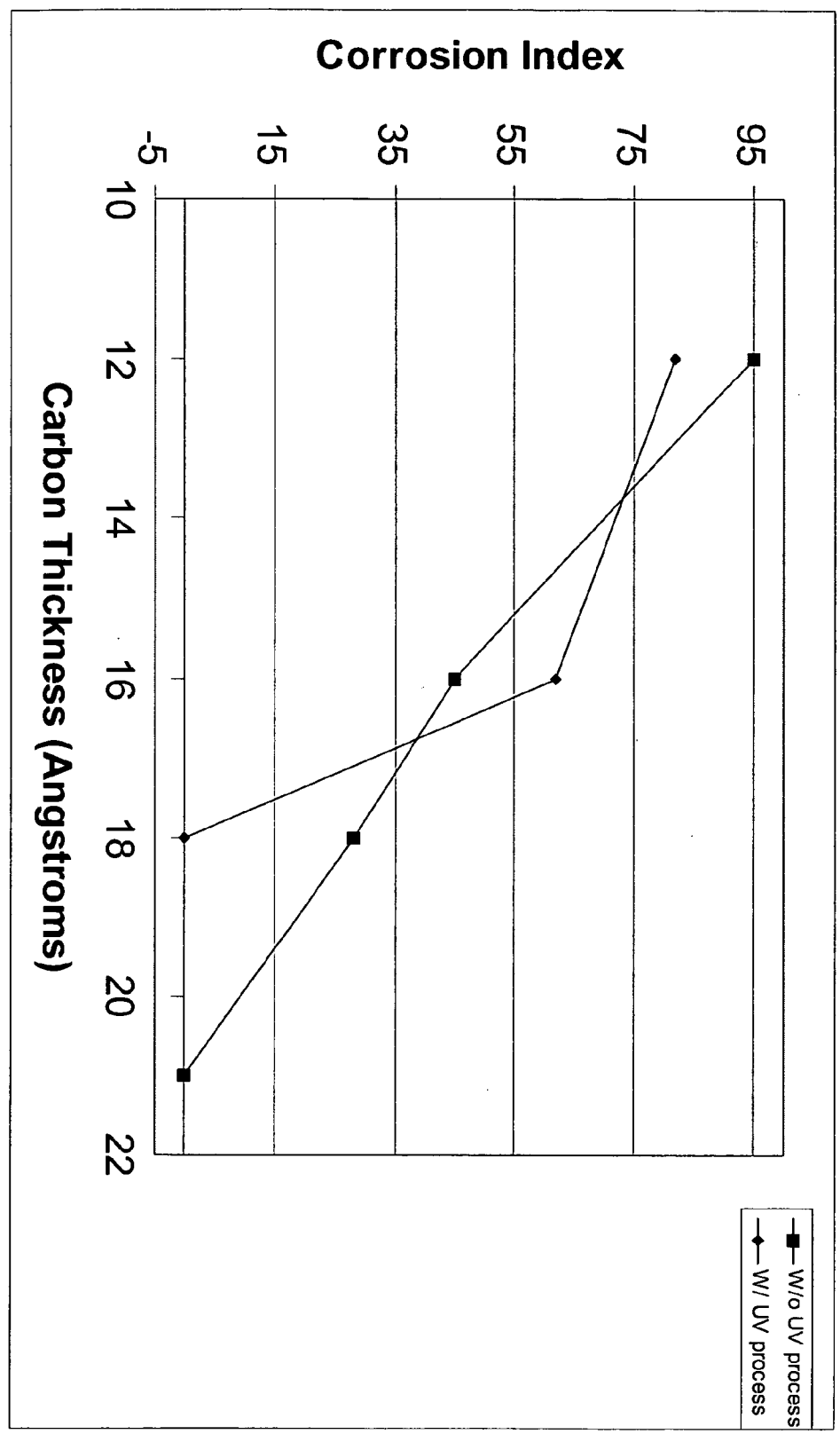
Figure 5:
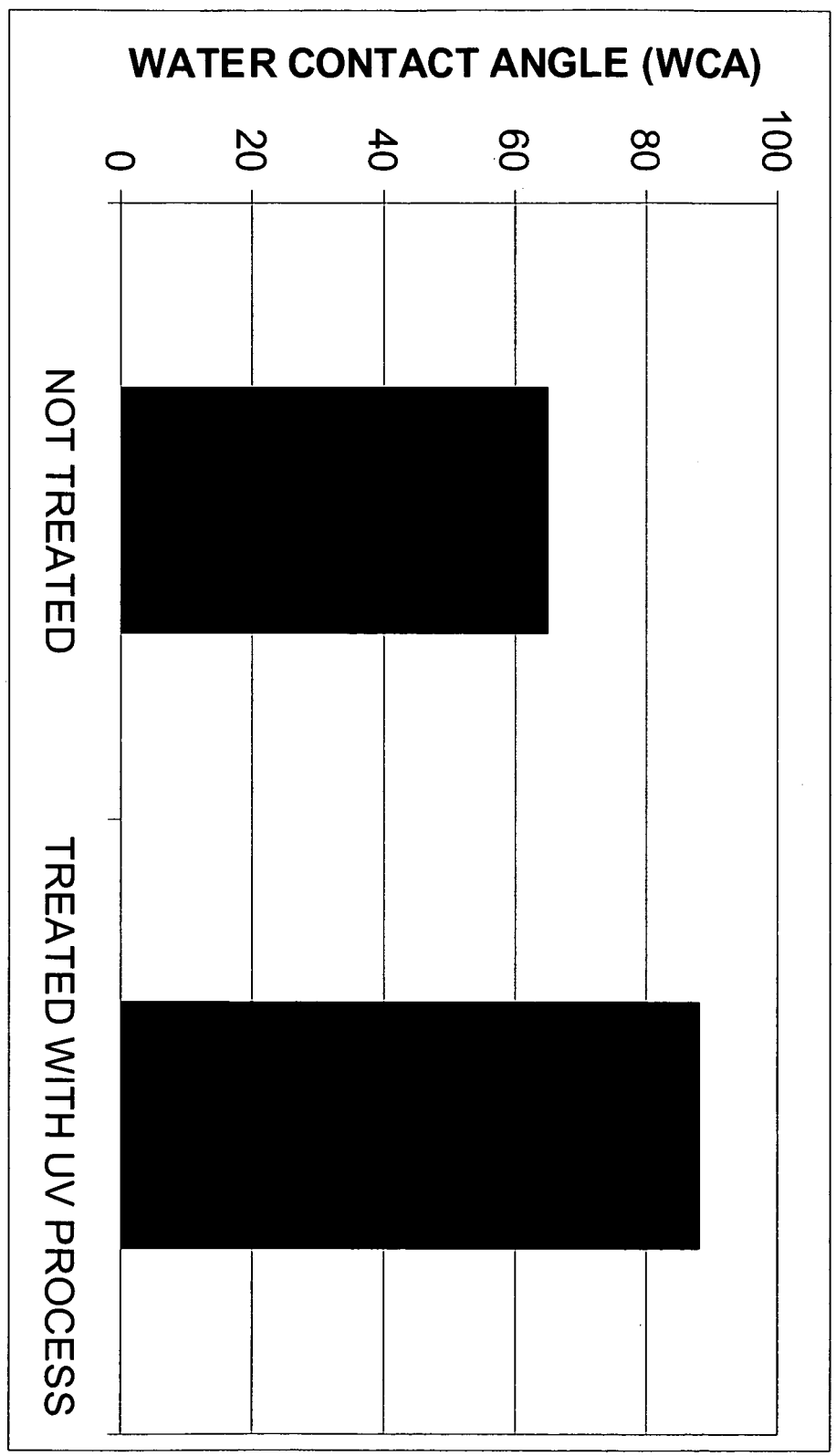

FIG. 4 is a graph showing and comparing the corrosion index of a magnetic media structure as a function of carbon thickness in angstroms for both a magnetic media structure having UV treated DLC protective layer and for a magnetic media structure having a DLC protective layer without UV treatment; and FIG. 5 is a bar chart showing and comparing the water contact angle (WCA) of magnetic media having approximately twelve angstroms of Zdol lubricant deposited over prior art non-treated DLC protective overcoat as well as twelve angstroms of Zdol lubricant deposited over a DLC protective overcoat that has been treated with UV light in a inert hydrophobic environment, in accordance with one embodiment of the invention.

DETAILED DESCRIPTION OF THE PREFERRED EMBODIMENTS

The invention provides a system and method for protecting magnetic media. The invention is directed to a method for treating magnetic media with ultraviolet (UV) light under an inert hydrophobic chemical environment before applying a lubricant overcoat to the magnetic media.

Figure 1A:
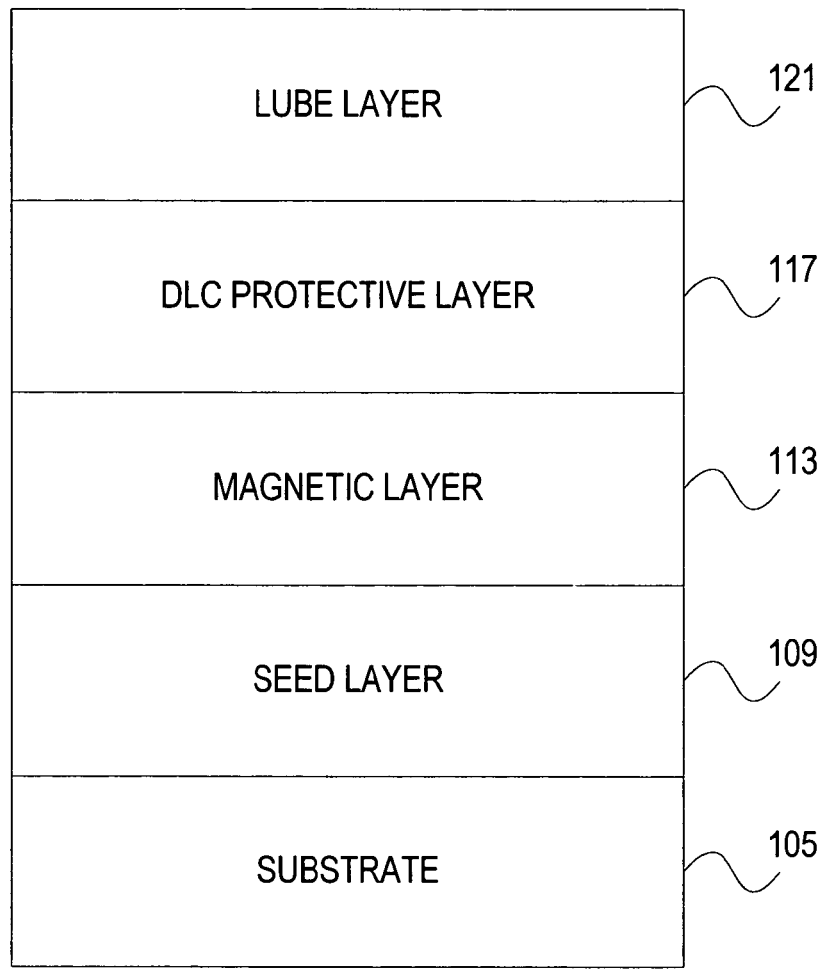
FIG. 1A is a block diagram showing a prior art conventional magnetic media structure with a lubricant layer.
Figure 1B:
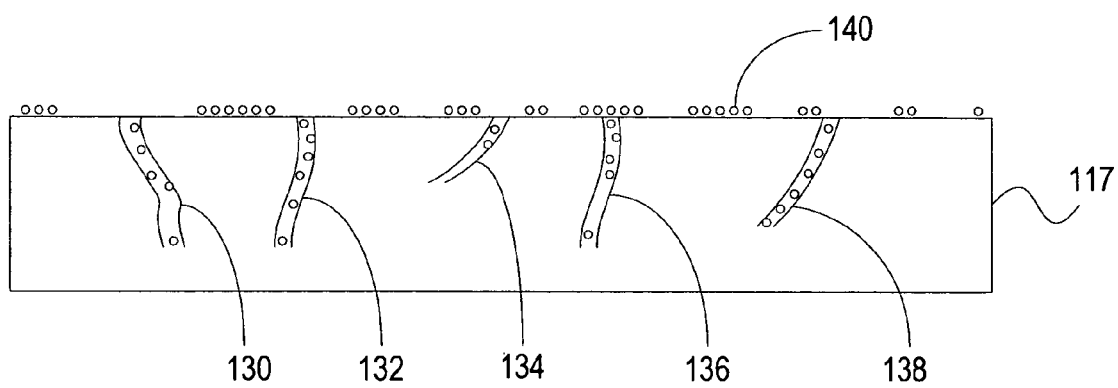
FIG. 1B shows an enlarged view of the DLC protective layer 117 of FIG. 1A.
Figure 1C:
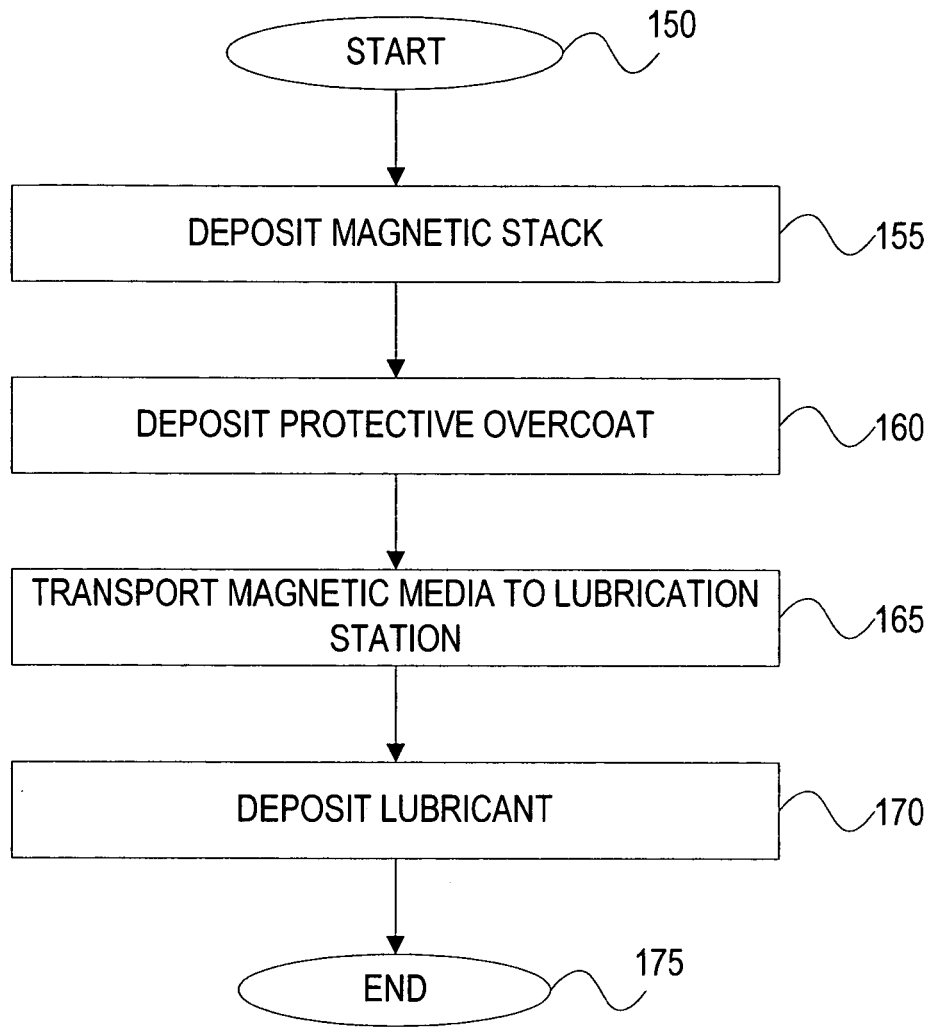
FIG. 1C is flowchart showing the prior art method of making a conventional magnetic media structure with lubricant.
Figure 2:
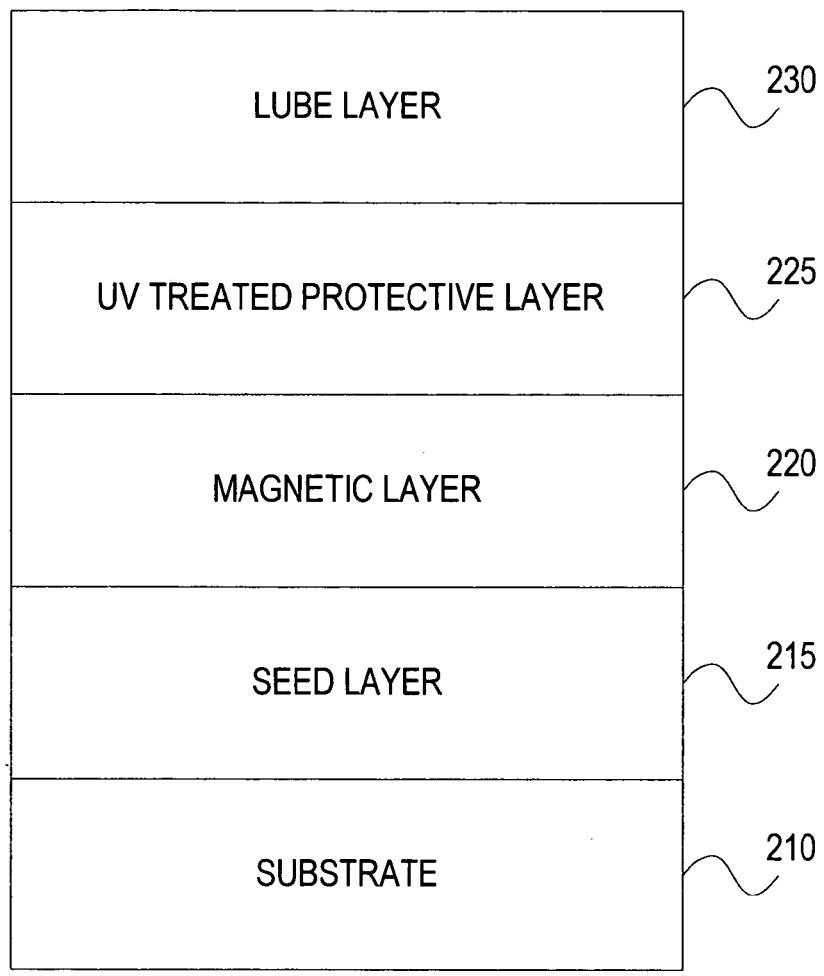
FIG. 2A is a block diagram showing a magnetic media structure with a protective layer that has been treated with UV in an inert hydrophobic environment.
FIG. 2B is an enlarged view of the UV treated protective layer 225 with pinholes of FIG. 2A.

FIG. 2A is a block diagram showing a magnetic media stack 200 having a protective overcoat that has been treated with (UV) light in an inert hydrophobic chemical environment in accordance with one embodiment of the invention. Magnetic media 200 includes a substrate 210, a seed layer 215, a magnetic layer 220, a UV treated protective overcoat layer 225, and a lubrication layer 230. The substrate 210 is typically made of nickel-phosphorous plated aluminum or glass that has been textured. The seed layer 215, typically made of chromium, is a thin film that is deposited onto the substrate 210 creating an interface of intermixed substrate 210 layer molecules and seed layer 215 molecules between the two. The magnetic layer 220 is typically made of one or more magnetic alloys containing cobalt (Co), platinum (Pt) and chromium (Cr). Additionally, magnetic layer 220 can be a structure made of layers of magnetic alloys and spacers. Magnetic Layer 220 is a thin film or stack of thin films deposited on top of the seed layer 215.

Protective overcoat layer 225 is typically made of a carbon containing material such as diamond-like-carbon (DLC), nitrogenated carbon, or nitrogenated DLC. The protective overcoat 225 is typically deposited over magnetic stack 220 using conventional thin film deposition techniques including ion beam deposition (IBD), plasma enhanced chemical vapor deposition (PECVD), magnetron sputtering, radio frequency sputtering, or chemical vapor deposition (CVD). In one embodiment, the DLC protective layer 225 is prepared by ion beam deposition using a work gas is $C_2H_2$. The energy per C atom is 90 eV.

After the DLC protective layer has been deposited it is exposed to UV light in a hydrophobic chemical environment as discussed in more detail with reference to FIG. 3 below. The UV treatment in a hydrophobic environment of the DLC protective layer fills in the pores preventing moisture from penetrating into the magnetic layer causing corrosion of the magnetic layer, as discussed in more detail with reference to FIG. 2B below.

Lubrication layer 230 includes hybrid lubricant films containing both perfluoropolyether (PFPE) moiety and cyclotriphosphazene moiety such as Zdol. Conventional lubrication processes such as dipping can be used to apply the lubricant.

Magnetic media 200 with UV treated lubrication layer 230 can be used in a disc drive to give improved performance as is further discussed below with reference to FIGS. 4 and 5. A disc drive using a magnetic media 200 with UV treated lubrication layer 230 also includes a motor for spinning the magnetic media at many thousand revolutions per minute about its center of rotation, a transducer for magnetically reading and writing information on the magnetic media while the magnetic media is rotated about center axis. Those skilled in the art will recognize that other components needed to construct a disk drive, such as the housing and Head-Stack-Assembly, are also included and all are maintained within a housing. The lubrication layer 230 permits the transducer, which is mounted on a glide assembly, to glide over the rotating disk reliably for long periods of time.

It should also be noted that the transducer is a read write head that is made of thin films including a protective overcoat thin film. This protective overcoat on the head can also be treated with UV light in a hydrophobic environment resulting in reduced corrosion and better performance in much the same way the magnetic media improves.

Figure 2B:
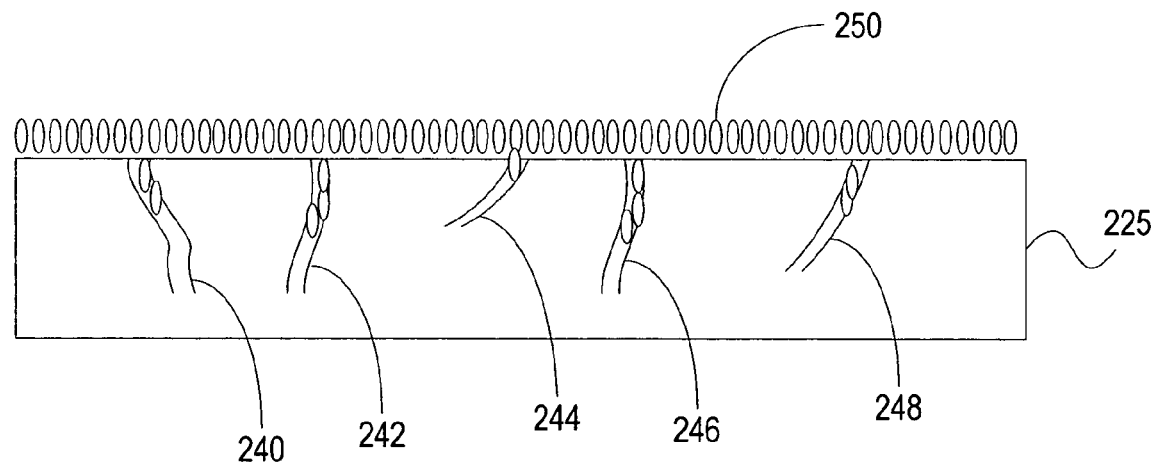

FIG. 2B is an illustration showing an enlarged view of the UV treated protective layer 225 with pinholes that have been sealed with a hydrophobic chemical while in an inert hydrophobic chemical environment to prevent moisture from penetrating through the DLC protective layer 225 and cause corrosion. UV treated protective layer 225 includes first pinhole 240, second pinhole 242, third pinhole 244, fourth pinhole 246, and fifth pinhole 248. Hydrophobic chemicals 250 are deposited on the surface of UV treated protective layer 225 and migrate down into the pinholes. Some of the pinholes are deeper than others. Hydrophobic chemicals 250 can migrate down the deeper holes as well as stay on top of the surface sealing the surface and preventing water molecules from diffusing down into the magnetic layer 220. Some examples of hydrophobic chemicals 250 used include low molecular weight perfluoropolyether, fluoroalkane, fluoroether, chlorofluoroalkane, chlorofluoroether, Vertrel XF, etc.

Figure 3:
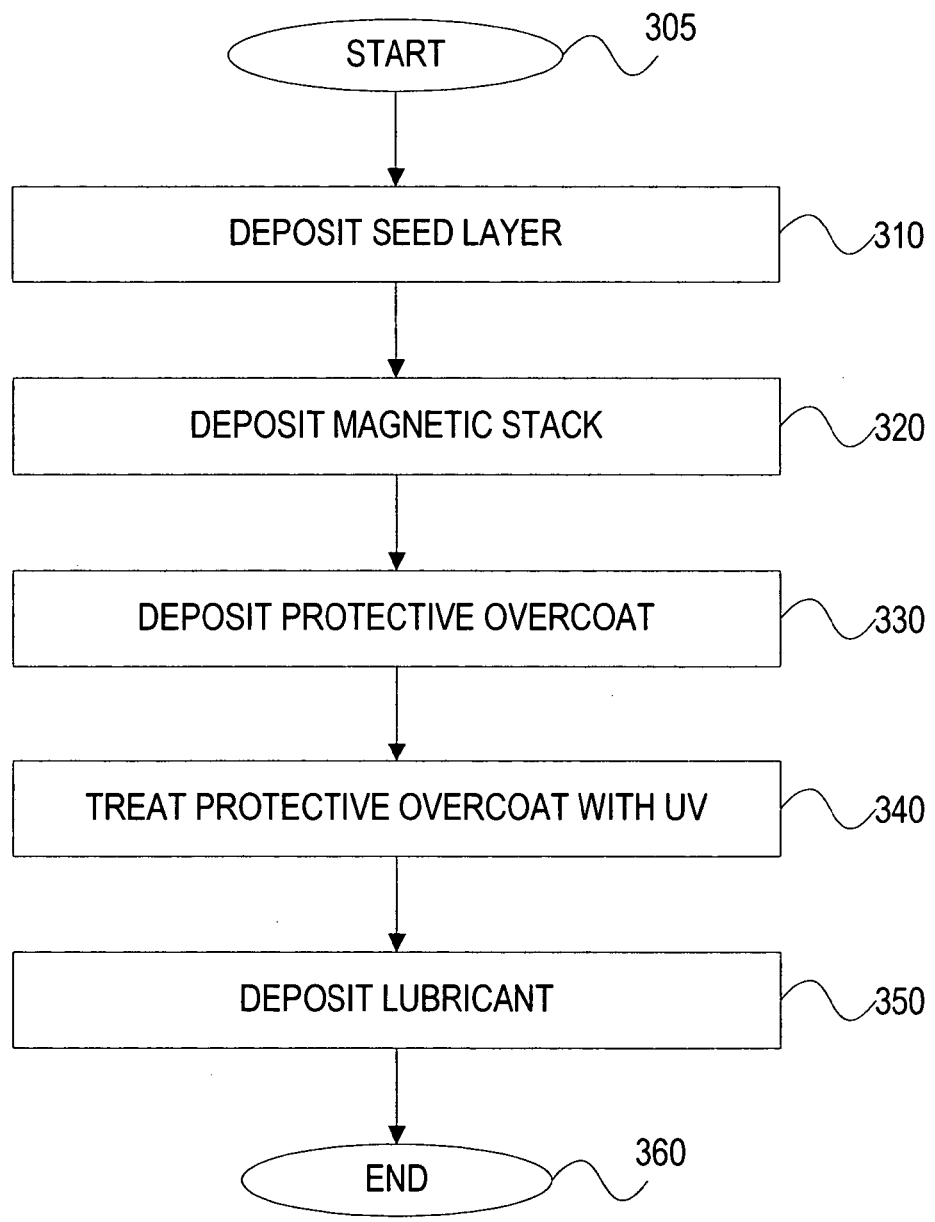
FIG. 3 is a flowchart showing the preferred method of making a magnetic media with a protective layer that has been treated with UV in an inert hydrophobic environment, in accordance with the invention.

FIG. 3 is a flow chart showing the preferred steps used to make a magnetic media stack having a protective overcoat that has been treated with (UV) light in an inert hydrophobic chemical environment before applying a lubrication layer over the magnetic media. The process begins with step 305 by preparing a substrate for thin film deposition. The preparation process of step 305 includes obtaining a disc substrate, texturing the substrate and cleaning the substrate. These processes are well known by those skilled in the art.

Next in step 310, a seed layer is deposited onto the substrate. This seed layer can consist of a chromium based materials or other materials well known in the art to assist in obtaining magnetic properties. Next in step 320, the magnetic stack is deposited on the textured substrate. This process usually involves consecutively depositing a series of thin film layers onto the textured substrate. These consecutively deposited layers usually include underlayers, additional seed layers, spacer layers and a variety of magnetic layers. The magnetic stack provides the magnetic properties needed for magnetic recording including such properties as coercivity, remnant moment, and squareness. The deposition process can be done by various thin film deposition techniques including ion beam deposition (IBD), plasma enhanced chemical vapor deposition (PECVD), magnetron sputtering, radio frequency sputtering, or chemical vapor deposition (CVD).

Next in step 330 the protective overcoat layer 225 is deposited over the magnetic stack. The protective overcoat layer 225, which is typically diamond like carbon (DLC), can be deposited using a variety of thin film deposition techniques including ion beam deposition (IBD), plasma enhanced chemical vapor deposition (PECVD), magnetron sputtering, radio frequency sputtering, or chemical vapor deposition (CVD). In one embodiment, the DLC protective overcoat layer 225 is prepared by ion beam deposition using a work gas is $C_2H_2$. The energy per C atom is 90 eV.

Next in step 340 the DLC protective overcoat layer 225 is exposed to UV light while being exposed to a hydro- phobic chemical environment. Typically this includes exposing the magnetic media having the DLC protective overcoat layer 225 to UV light for a fixed amount of time. The amount of time needed varies from lubricant to lubricant and is typically around 120 seconds. Also, the amount of time needed is a minimum threshold that sufficiently fills the voids in the protective overcoat 225 to prevent diffusion of moisture through to the magnetic layer. The amount of time depends on the type of hydrophobic chemical being used. Some examples of hydrophobic chemicals used include low molecular weight perfluoropolyether, fluoroalkane, fluoroether, chlorofluoroalkane, chlorofluoroether, Vertrel XF, etc. In addition to just varying the time of UV light exposure, other factors can contribute to the UV treatment of the DLC layer such as temperature and light intensity.

Therefore, step 340 involves transporting the magnetic media having the DLC protective overcoat 225 from the vacuum chamber used to deposit the DLC protective overcoat 225, which is usually at low pressures of several millitorr, to a processing chamber containing hydrophobic chemicals at approximately atmospheric pressure. Once the magnetic media is in this hydrophobic chemical chamber the DLC protective overcoat 225 is exposed to UV light. The UV light is generated using a low-pressure mercury discharge lamp having predominate wavelengths of 185 nm and 254 nm. About 15% of the light from the low-pressure mercury discharge lamp is 185 nm wavelength light and about 85% of the light is 254 nm wavelength light. The improvements of magnetic media are illustrated and discussed with reference to FIGS. 4 and 5 below.

UV irradiation of the surface of the protective overcoat removes absorbed moisture from that surface. The inert hydrophobic chemical in the processing environment replace the moisture from that is removed from the surface and rejuvenates the surface. The UV irradiation is done in an inert hydrophobic chemical environment so that moisture is prevented from reabsorbing back on the protective overcoat surface. The hydrophobic chemicals occupy the pinhole surfaces before the media is exposed to moisture in ambient atmosphere. Since the hydrophobic chemicals occupy the pinholes, moisture is prevented from penetrating through the pinholes and corroding the layers beneath the surface. Therefore, media should be kept in either an atmosphere saturated with hydrophobic chemical vapor or even in a hydrophobic chemical solution during the UV exposure.

Next in step 350 a lubricant layer is deposited over the DLC protective overcoat 225 that has been exposed to UV irradiation in a hydrophobic chemical environment. The lubricant layer can be applied using several processes including dipping the magnetic media having an overcoat into a tank of lubricant fluid or vapor lubing the disk. If the lubricant layer is applied with a dipping process wherein the magnetic media having the UV treated protective overcoat is dipped in a tank of lubricant fluid, then the magnetic media is typically taken into an atmospheric environment and put into a tank. The thickness of the lubricant, which is left on the magnetic media, is controlled by the rate at which the lubricant is drained from the tank. The thickness can also be controlled by other means such as the rate at which the magnetic media is removed from the tank of lubricant fluid or the kind of additives in the lubricant. If the lubricant layer is applied with a vapor lubing process then the magnetic media with protective overcoat can be lubed under controlled environment in the same processing tool as the previous thin films were prepared or it can be taken out of vacuum and loaded into a different vapor-lubing tool.

The lubricant layer can include hybrid lubricant films containing both perfluoropolyether (PFPE) moiety and cyclotriphosphazene moiety. For example Moresco lubricant, which was developed by Matsumura Oil research Company, is often used as a lubricant. Also Zdol is often used a lubricant.

Finally in step 360, the magnetic media having the DLC protective overcoat 225 treated with UV light in a hydrophobic chemical environment and subsequently lubricated is transferred to the next process step which can be a buff, or wipe, or test process.

FIG. 4 is a graph showing the corrosion index of a magnetic media structure as a function of carbon thickness, in angstroms, for both a magnetic media structure having UV treated DLC protective layer and for a magnetic media structure having a DLC protective layer without UV treatment. The FIG. 4 data shows that corrosion is not detectable on disks having UV treated DLC protective overcoat that is thicker than 18 Angstroms whereas corrosion is not detectable on disks not having UV treated DLC protective overcoat that is thicker than 21 Angstroms. Therefore by treating the DLC protective overcoat with UV in a hydrophobic environment, the thickness of the DLC protective layer can be reduced by 3 Angstroms or by 14% without affecting the corrosion properties. The improvement in corrosion is seen throughout the entire DLC protective layer thickness range of 12 to 21 Angstroms. FIG. 4 data shows for both UV treated and non-UV treated DLC protective layers, the corrosion index increases as the DLC protective layer decreases.

FIG. 5 is a bar chart showing the water contact angle (WCA) of magnetic media having approximately twelve angstroms of Zdol lubricant deposited over a non-treated DLC protective overcoat as well as twelve angstroms of Zdol lubricant deposited over a DLC protective overcoat that has been treated with UV light in a inert hydrophobic environment, in accordance with one embodiment of the invention. FIG. 5 is a side-by-side comparison of the WCA data for magnetic media having the prior art DLC protective overcoat and for magnetic media having a UV treated DLC protective overcoat. The UV treated DLC protective overcoat is prepared by exposing the DLC protective overcoat to approximately 2 minutes of UV light in an environment saturated with Vertrel XF.

The WCA for 12 Angstroms of Zdol lubricant without any exposure to UV light, except for background light, is about 63 degrees. As the UV light exposure time increases so does the WCA. Exposing the lubricant layer to 2 minutes of UV light in an inert hydrophobic environment increases the WCA to about 87 degrees. Therefore, exposing the DLC protective layer to two minutes of UV light in an inert hydrophobic environment made out of an atmosphere of saturated Vertrel XF increases the WCA by approximately 40%.

The performance of magnetic media with UV treated lubricant improves with increasing time of exposure to UV light for up to about 2 minutes. If the carbon based protective layer is exposed to UV light for more than 2 minutes in a regular atmosphere, the carbon based protective layer can begin to degrade. Therefore, the magnetic disk performance is maximized when the carbon based protective layer is exposed to as much UV light as possible in an inert hydrophobic environment, without degradation.

This large range of acceptable processing times makes this process adaptable to factory throughput concerns. In fact, factory throughput can often be a factor used to determine if a process is feasible. This method of treating lubricants with UV light is adaptable for different throughputs because there is significant improvement in media reliability over a large time processing window. Although exposing carbon based protective layers to about 2 minutes of UV light in an inert hydrophobic environment can lead to good performance results, a lower exposure time in a hydrophobic environment of a different chemical or different pressure can give nearly the same performance results and is better for throughput. UV exposure times of 30 to 40 seconds also significantly improve magnetic media performance and can be used to both significantly improve magnetic media performance while maintaining a reasonable throughput. Those skilled in the art will recognize that the variables of exposure time, hydrophobic chemical and processing pressure can be varied to optimize this process for many different kinds of setups and applications.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

We claim:

1. A method of manufacturing a magnetic storage medium, the method comprising: depositing a solid protective overcoat over a magnetic layer formed on a substrate; treating the protective overcoat with ultraviolet light in a hydrophobic environment, the hydrophobic environment comprising a hydrophobic chemical, wherein the protective overcoat comprises the hydrophobic chemical and the hydrophobic chemical forms a hydrophobic surface on the protective overcoat after being treated with ultraviolet light in the hydrophobic environment; and subsequently depositing a lubricant material over the protective overcoat comprising the hydrophobic chemical to form a lubricating layer, wherein the lubricant material is deposited after treating the protective overcoat with ultraviolet light for a time period in the hydrophobic environment, and wherein the lubricant material is deposited upon the hydrophobic surface of the protective overcoat to form the lubricating layer.

2. The method of claim 1, wherein the protective overcoat comprises water molecules prior to exposure to ultraviolet light treatment.

3. The method of claim 1, wherein the time period is less than about two minutes.

4. The method of claim 1, wherein the time period is less than about 1 minute.

5. The method of claim 1, wherein the time period is approximately 20 seconds to approximately 40 seconds.

6. The method of claim 1, wherein the ultraviolet light comprises ultraviolet light having a wavelength of one or more of 185 nm or 254 nm.

7. The method of claim 1, wherein the protective overcoat comprises a solid carbon containing material.

8. The method of claim 1, wherein the hydrophobic chemical comprises at least one of perfluoropolyether, fluoroalkane, fluoroether, chlorofluoroalkane, or chlorofluoroether.

9. The method of claim 1, wherein the hydrophobic chemical is in a gas phase.

10. The method of claim 1, further comprising:
    depositing a seed layer on the substrate; and
    depositing the magnetic layer on the seed layer.

11. The method of claim 1, wherein the protective overcoat comprises a diamond-like carbon.

12. A method comprising:
    treating a solid protective overcoat deposited on a magnetic layer via ultraviolet light in a hydrophobic environment, the hydrophobic environment comprising a hydrophobic chemical, the protective overcoat comprising a plurality of pores in a surface of the protective overcoat, wherein the hydrophobic chemical forms a hydrophobic surface on the protective overcoat; and
    subsequently depositing a lubricant material on the protective overcoat to form a lubricant layer, wherein the lubricant material is deposited after treating the protective overcoat with ultraviolet light in the hydrophobic environment;
    wherein the plurality of pores in the surface of the protective overcoat contain the hydrophobic chemical of the hydrophobic environment when the lubricant material is deposited on the protective overcoat, and
    wherein the lubricant material is deposited upon the hydrophobic surface of the protective overcoat to form the lubricating layer.

13. The method of claim 12, wherein the plurality of pores in the surface of the protective overcoat have a pore depth that is less than a thickness of the protective overcoat.

14. The method of claim 12, wherein the protective overcoat comprises a diamond-like carbon.

15. A method of manufacturing a magnetic recording medium, the method comprising:
    treating a solid protective overcoat of the magnetic recording medium with ultraviolet light while exposing the protective layer to a hydrophobic environment comprising hydrophobic molecules in order to remove water molecules from the protective overcoat and to incorporate the hydrophobic molecules into the protective overcoat so that the protective overcoat comprises the hydrophobic molecules, wherein the hydrophobic molecules form a hydrophobic surface on the protective overcoat, wherein the protective overcoat is adjacent to a magnetic layer formed on a substrate; and
    subsequently depositing a lubricant material on the protective overcoat to form a lubricating layer, wherein the lubricant material is deposited after treating the protective overcoat with ultraviolet light while exposing the protective overcoat to the hydrophobic environment;
    wherein the lubricant material is deposited upon the hydrophobic surface of the protective overcoat to form the lubricating layer.

16. The method of claim 15, wherein the protective overcoat comprises a diamond-like carbon.

* * * * *